(12) United States Patent
Mikhael

(10) Patent No.: US 10,498,231 B2
(45) Date of Patent: Dec. 3, 2019

(54) CHARGE PUMP CIRCUITRY

(71) Applicant: SOCIONEXT INC., Yokohama-shi, Kanagawa (JP)

(72) Inventor: David Hany Gaied Mikhael, Langen (DE)

(73) Assignee: SOCIONEXT, INC., Yokohama (JP)

(*) Notice: Subject to any disclaimer, the term of this patent is extended or adjusted under 35 U.S.C. 154(b) by 0 days.

(21) Appl. No.: 16/244,019

(22) Filed: Jan. 9, 2019

(65) Prior Publication Data

US 2019/0229614 A1 Jul. 25, 2019

(30) Foreign Application Priority Data

Jan. 19, 2018 (EP) ..................................... 18152586

(51) Int. Cl.
*G05F 1/10* (2006.01)
*H02M 3/07* (2006.01)
*H03F 3/45* (2006.01)

(52) U.S. Cl.
CPC .......... *H02M 3/07* (2013.01); *H03F 3/45269* (2013.01); *H03F 3/45273* (2013.01)

(58) Field of Classification Search
CPC ........ H03F 3/195; H03F 3/245; H03F 1/0277; H03F 1/0227
See application file for complete search history.

(56) References Cited

U.S. PATENT DOCUMENTS

| 5,760,640 | A | 6/1998 | Girard et al. |
| 6,124,755 | A | 9/2000 | Parker et al. |
| 2005/0184774 | A1* | 8/2005 | Kaizuka ................ H03L 7/0896 327/157 |
| 2006/0022727 | A1 | 2/2006 | Kim |
| 2011/0199152 | A1 | 8/2011 | Swei et al. |
| 2015/0318859 | A1 | 11/2015 | Fang et al. |

OTHER PUBLICATIONS

Extended European Search Report of related European Patent Application No. 18152586.6, dated Aug. 9, 2018.

* cited by examiner

*Primary Examiner* — Sibin Chen
(74) *Attorney, Agent, or Firm* — Arent Fox LLP

(57) ABSTRACT

Charge pump circuitry comprises a differential amplifier and parallel-connected reference, auxiliary and output current paths comprising first current-mirror transistors connected so an auxiliary current and a first output current along a first part of the output current path are dependent on the reference current. The auxiliary and output current paths comprise second-current-mirror transistors connected so a second output current flowing along a second part of the output current path is dependent on the auxiliary current. The auxiliary current path comprises a control transistor connected in series with the first-current-mirror transistor of that path. The differential amplifier receives first and second input signals from nodes in the auxiliary and output current paths, respectively, and controls the control transistor with its amplifier output signal to control the drain or collector voltage of the first-current mirror transistor in the auxiliary path.

15 Claims, 5 Drawing Sheets

CHARGE PUMP CIRCUITRY

CROSS-REFERENCE TO RELATED APPLICATION

This application claims priority from European Patent Application No. 18152586.6 filed Jan. 19, 2018. The entire contents of the prior application are incorporated herein by reference.

The present invention relates to charge pump circuitry.

One possible application of such charge pump circuitry is in phase locked loop (PLL) circuitry. PLL circuitry may be used to generate one or more clock signals, for example for use by analogue-to-digital converter (ADC) or digital-to-analogue converter (DAC) circuitry.

Some conventional charge pump circuits control a current signal using a current source to provide a positive (i.e. outward flowing) current and a current sink to provide a negative (i.e. inward-flowing) current.

By way of background, FIG. 1 is a schematic diagram of a previously-considered charge pump circuit 100, useful for obtaining a general overview of the class of charge pump circuits considered herein. Charge pump circuit 100 comprises current source 110, current sink 120, UP (up) switch 150, DN (down) switch 160, low voltage supply (e.g. ground or GND) 200, output node 210 and high voltage supply (e.g. VDD) 220.

An UP signal 130 controls the UP switch 150 to be on or off, and a DN signal 140 controls the DN switch 160 to be on or off. When the UP switch 150 is turned on, a source current 170 flows from the current source 110 to the output node 210. Similarly, when the DN switch 160 is turned on, a sink current 180 is drawn by current sink 120 from the output node 210. Turning either of the switches 150 and 160 off breaks the flow of the relevant current as regards the output node 210.

The source current 170 and the sink current 180 are combined to form an output current 190 at the output node 210. The magnitude of the output current 190 depends on the proportions of source current 170 and sink current 180 which contribute towards the output current 190. The proportions of source current 170 and sink current 180 are controlled by the UP signal 130 and the DN signal 140, whereby if the UP signal 130 is held high for a longer duration of time than the DN signal 140, a larger proportion of the output current 190 will be source current 170 provided by the current source 110. In order to accurately control the magnitude of the output current 190 in this way, the current source 110 and the current sink 120 should preferably be configured to generate constant (bias) currents.

In some previously-considered charge pump circuits, the current sink and current source are created by current-mirror arrangements using PMOS and/or NMOS MOSFETs. FIG. 2 presents a schematic diagram of a charge pump circuit 400 by way of background.

Charge pump circuit 400 comprises a reference current path 470, an auxiliary current path 480, and an output current path 490, connected in parallel between a high voltage source 410 and low voltage source 420.

A current source 430 is connected in the reference current path 470 (effectively sinking current towards the low voltage source 420) and generates a reference or bias current Ibp in the reference current path 470.

A first current-mirror arrangement 440 is provided as a PMOS MOSFET current-mirror and is configured to mirror the reference current from the reference current path 470 to the auxiliary current path 480 and to part of the output current path 490. A second current-mirror arrangement 450 is provided as an NMOS current-mirror and is configured to mirror the auxiliary current from the auxiliary current path 480 to part of the output current path 490.

In more detail, the first current-mirror arrangement 440 comprises first current-mirror transistors 442, 444, and 446, being PMOS MOSFETs and each comprising a gate terminal, a source terminal and a drain terminal. The first current-mirror transistor 446 is connected in the reference current path 470, the first current-mirror transistor 444 is connected in the auxiliary current path 480, and the first current-mirror transistor 442 is connected in the output current path 490.

The gate terminals of the first current-mirror transistors 446, 444, 442 are connected together such that all three transistors have the same gate voltage. Also, the source terminals of the first current-mirror transistors 446, 444, 442 are connected together at the high voltage source 410 such that all three transistors have the same source voltage. The gate terminal and the drain terminal of the first current-mirror transistor 446 of the reference current path 470 are connected together thereby forcing the first current-mirror transistor 446 into the saturation region (in low-power arrangements, the transistor could be forced into subthreshold rather than saturation). Thus, the current flowing through the first current-mirror transistor 444 of the auxiliary current path 480 and through the first current-mirror transistor 442 (being a first part) of the output current path 490 is related to the current flowing through the first current-mirror transistor 446 of the reference current path 470 due to current mirroring. The first current-mirror transistor 442 of the output current path 490 therefore acts as a current source for the output current path 490. Also, the first current-mirror transistor 444 of the auxiliary current path 480 acts as a current source for the auxiliary current path 480.

The second current-mirror arrangement 450 comprises second current-mirror transistors 452 and 454, being NMOS MOSFETs and each comprising a gate terminal, a source terminal and a drain terminal. The second current-mirror transistor 454 is connected in the auxiliary current path 480 and the second current-mirror transistor 452 is connected in the output current path 490.

The gate terminals of the second current-mirror transistors 452 and 454 are connected together such that they have the same gate voltage. Also, the source terminals of the second current-mirror transistors 452 and 454 are connected together at the low voltage source 420 such that they have the same source voltage. The gate terminal and the drain terminal of the second current-mirror transistor 454 of the auxiliary current path 480 are connected together thereby forcing the second current-mirror transistor 454 into the saturation region (in low-power arrangements, the transistor could be forced into subthreshold rather than saturation). Thus, the current flowing through the second current-mirror transistor 452 (being a second part) of the output current path 490 is related to the current flowing through the second current-mirror transistor 454 of the auxiliary current path 480 due to current mirroring. The second current-mirror transistor 452 of the output current path 490 therefore acts as a current sink for the output current path 490.

The output current path 490 is divided into first and second parallel sub-paths 492 and 494 between the first current-mirror transistor 442 and the second current-mirror transistor 452. Switching means 460 are connected in the first and second parallel sub-paths 492 and 494.

The switching means 460 comprises a first steering transistor 462, a second steering transistor 464, a third steering transistor 466 and a fourth steering transistor 468. The first and third steering transistors 462, 466 are PMOS MOSFETs and the second and fourth steering transistors 464, 468 are NMOS MOSFETs. The first and second steering transistors 462 and 464 are connected along the first parallel sub-path 492 between the first current-mirror transistor 442 and the second current-mirror transistor 452 in that order. The third and fourth steering transistors 466 and 468 are connected along the second parallel sub-path 494 between the first current-mirror transistor 442 and the second current-mirror transistor 452 in that order.

An output node 469 is defined in the first parallel sub-path 492 between the first and second steering transistors 462 and 464. A bypass node 496 is defined in the second parallel sub-path 494 between the third and fourth steering transistors 466 and 468.

The first and third steering transistors 462, 466 are switching transistors configured to receive UP control signals /U and U, respectively. The second and fourth steering transistors 464, 468 are switching transistors configured to receive DOWN control signals D and /D, respectively. For example, the control signals may be digital or logic signals having values of "1" or "0", where the value "0" turns the switching PMOS transistors completely on and the value "1" turns the switching PMOS transistors completely off, and vice versa for the switching NMOS transistors.

Therefore, the first steering transistor 462 is configured to control the proportion of current that is supplied by the first current-mirror transistor 442 (current source) to the output node 469. The second steering transistor 464 is configured to control the proportion of current that is drawn by the second current-mirror transistor 452 (current sink) from the output node 469. The third steering transistor 466 is configured to control the proportion of current that is supplied by the first current-mirror transistor 442 (current source) to the bypass node 496. The fourth steering transistor 468 is configured to control the proportion of current that is drawn by the second current-mirror transistor 452 (current sink) from the bypass node 496.

With the control signals control signals /U and U, and D and /D, being pairs of complementary digital signals, it will be appreciated that the current that is supplied by the first current-mirror transistor 442 is directed either to the output node 469 or the bypass node 496. Similarly, the current that is drawn by the second current-mirror transistor 452 is drawn either from the output node 469 or the bypass node 496.

The output node 469 is configured to output an output current signal to external circuitry (such as a loop filter of PLL circuitry) based on currents provided at the output node 469 as explained above. An effective (parasitic) capacitance at the bypass node 496 is charged up and discharged as currents flow in the second parallel sub-path 494, if the bypass node 496 is left floating. It may be preferred to connect (not shown) the bypass node 496 to a fixed voltage potential such as VDD/2. It may be further preferred to drive the bypass node 496 by a unity gain buffer (not shown) to follow the output node 469.

It is desirable to maintain accurate control of the output current at the output node 469 of the charge pump circuit 400. However, it has been found that in a case where the output voltage at the output node 469 varies over a wide range accuracy problems arise.

It is desirable to solve some or all of the above-mentioned problems.

According to an embodiment of a first aspect of the present invention, there is provided charge pump circuitry comprising: a reference current path, an auxiliary current path and an output current path connected in parallel between high and low voltage sources; and a differential amplifier configured to generate an amplifier output signal based upon a difference between first and second input signals, wherein: the reference current path is configured to cause a reference current to flow along that path; the reference, auxiliary and output current paths comprise respective first current-mirror transistors connected in a first current-mirror arrangement so that an auxiliary current flowing along the auxiliary current path and a first output current flowing along a first part of the output current path are dependent on the reference current flowing along the reference current path due to current mirroring; the auxiliary and output current paths comprise respective second current-mirror transistors connected in a second current-mirror arrangement so that a second output current flowing along a second part of the output current path is dependent on the auxiliary current flowing along the auxiliary current path due to current mirroring; the output current path comprises an output node for connection to an external load to allow current to flow between the charge pump circuitry and the external load dependent on the first and second output currents; the auxiliary current path comprises a control transistor connected in series with the first current-mirror transistor of that path; and the differential amplifier is connected to receive its first and second input signals from nodes in the auxiliary and output current paths, respectively, at which nodes the signals generated are indicative of the drain or collector voltages of the first current-mirror transistors in those paths, and configured to control the control transistor with its amplifier output signal so as to control the drain or collector voltage of the first current-mirror transistor in the auxiliary path.

As explained in detail later, the arrangement of the differential amplifier and the control transistor in particular enable improved noise performance, in particular in reduced noise in the output current at the output node.

The reference current path may comprise a control transistor connected in series with the first current-mirror transistor of that path. The differential amplifier may be configured to control the control transistors with its amplifier output signal so as to control the drain or collector voltages of the first current-mirror transistors in the auxiliary and reference paths. This may lead to improved accuracy of the charge pump circuitry.

Thus, there may be control transistors in both the reference and auxiliary current paths, but no such control transistor in the output current path.

The configuration of the differential amplifier and the control transistor in the auxiliary path serves to reduce a noise impact of the differential amplifier and the control transistor in the auxiliary path on the auxiliary current. The first and second current-mirror arrangements serve to cause noise introduced in the reference current by the differential amplifier and the control transistor in the reference path to cancel in the output current path.

The differential amplifier may be configured to control the control transistor or both of the control transistors with its amplifier output signal so as to tend to equalise the drain or collector voltages of the first current-mirror transistors concerned.

The reference current path may comprise a current source configured to regulate the reference current. This may lead to increased accuracy of the output current at the output node.

The control transistor or each of the control transistors may be connected in series with the first current-mirror transistor of its path on the drain-terminal or collector-terminal side of that first current-mirror transistor.

The output current path may be split into first and second parallel sub-paths between the first current-mirror transistor and the second current-mirror transistor of the output current path. The sub-paths may comprise switching means configured to control the flow of the first and second output currents in the sub-paths.

The switching means may comprise first and second steering transistors connected in series along the first sub-path in a direction from the first current-mirror transistor to the second current-mirror transistor of the output current path, and third and fourth steering transistors connected in series along the second sub-path in said direction.

The first and third steering transistors may be operable to control how much of the first output current flows in the first and second sub-paths, and the second and fourth steering transistors may be configured to control how much of the second output current flows in the first and second sub-paths.

The switching means may be configured to receive a first pair of complementary control signals for controlling the first and third steering transistors, respectively, and a second pair of complementary control signals for controlling the second and fourth steering transistors, respectively, optionally wherein the control signals are digital (e.g. logic) signals.

The control transistor or each of the control transistors may be connected in series with the first current-mirror transistor of its path via a resistance.

The output node is on the first sub-path between the first and second steering transistors. A bypass node is on the second sub-path between the third and fourth steering transistors. The differential amplifier may be connected to receive its first input signal from a node between the resistance and the control transistor of the auxiliary current path and its second input signal from the output node or the bypass node.

Each said resistance may be implemented as a transistor configured to be on. The node at which the differential amplifier receives its first input signal may be at the drain or collector terminal of the resistance configured to be on of the auxiliary current path. The output node may be at the drain or collector terminal of the first steering transistor. The bypass node may be at the drain or collector terminal of the third steering transistor.

The transistors configured to be on and the first steering transistor may be matched transistors having substantially the same transistor size as one another. They may have a given size ratio between themselves.

The transistors configured to be on and the first and third steering transistors are matched transistors having substantially the same transistor size as one another. They may have a given size ratio between themselves.

The first current-mirror transistors may be matched transistors having substantially the same transistor size as one another. They may have a given size ratio between themselves. The second current-mirror transistors may be matched transistors having substantially the same transistor size as one another. They may have a given size ratio between themselves.

The differential amplifier may be connected to receive its first input signal from the drain or collector terminal of the first current-mirror transistor of the auxiliary current path and its second input signal from the drain or collector terminal of the first current-mirror transistor of the output path.

The source or emitter terminals of first current-mirror transistors may be connected together. The gate or base terminals of first current-mirror transistors may be connected together. The gate or base terminal of the first current mirror transistor of the reference current path may be connected to the drain or collector terminal of the control transistor of the reference current path or to the other side of the resistance of the reference current path from its drain or collector terminal.

The source or emitter terminals of second current-mirror transistors may be connected together, wherein the gate or base terminals of second current-mirror transistors are connected together, and wherein the gate and drain or base and collector terminals of the second current-mirror transistor of the auxiliary current path are connected together.

According to an embodiment of a second aspect of the present invention, there is provided dual charge pump circuitry, comprising: first charge pump circuitry according to the aforementioned first aspect of the present invention; second charge pump circuitry according to the aforementioned first aspect of the present invention; and control circuitry, wherein: the output nodes of the first charge pump circuitry and the second charge pump circuitry are connected together to form a common output node; and the control circuitry is configured to control the relative magnitudes of the reference currents of the first charge pump circuitry and the second charge pump circuitry in dependence upon a voltage level at the common output node.

Thus, it may be possible to allow one set of charge pump circuitry to dominate over the other at the common output node in dependence upon a voltage level at the common output node.

It may be that in the first charge pump circuitry the first current-mirror transistors are PMOS MOSFETs and in the second charge pump circuitry the first current-mirror transistors are NMOS MOSFETs. It may be that in the first charge pump circuitry the first current-mirror transistors are PNP BJTs and in the second charge pump circuitry the first current-mirror transistors are NPN BJTs. It may be that in the first charge pump circuitry the first current-mirror transistors are PMOS MOSFETs and in the second charge pump circuitry the first current-mirror transistors are NPN BJTs. It may be that in the first charge pump circuitry the first current-mirror transistors are PNP BJTs and in the second charge pump circuitry the first current-mirror transistors are NMOS MOSFETs.

The control circuitry may be configured to control the relative magnitudes of the reference currents of the first charge pump circuitry and the second charge pump circuitry so that: the reference current of the first charge pump circuitry is larger than the reference current of the second charge pump circuitry when the voltage level at the common output node is high; and the reference current of the second charge pump circuitry is larger than the reference current of the first charge pump circuitry when the voltage level at the common output node is low.

According to an embodiment of a third aspect of the present invention, there is provided a phase locked loop circuit comprising the charge pump circuitry according to the aforementioned first or second aspect of the present invention.

According to an embodiment of a fourth aspect of the present invention, there is provided integrated circuitry, comprising the charge pump circuitry according to the aforementioned first or second aspect of the present invention or the phase locked loop circuit according to the aforementioned third aspect of the present invention.

Reference will now be made, by way of example, to the accompanying drawings, of which:

Figure 1:
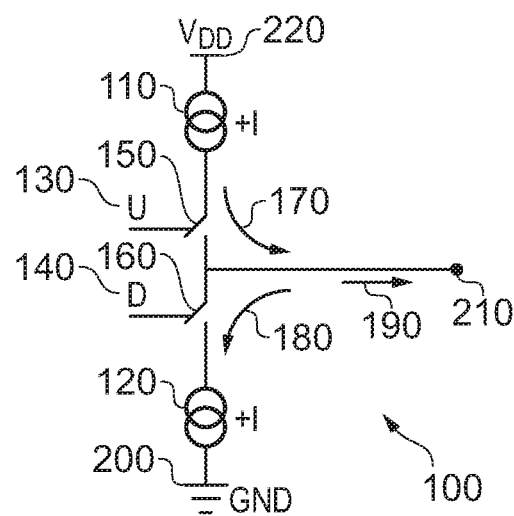
FIG. 1 is a schematic diagram of a charge pump circuit.

It is desirable to maintain the same current magnitudes of the currents generated by the first current-mirror arrangement 440 and the second current mirror arrangement 450 in order to accurately control the output current at the output node 469 of the charge pump circuit 400.

However, in a case where the output voltage at the output node 469 varies over a wide range (in particular, looking at FIG. 2, when it goes very high), the first current-mirror PMOS MOSFET transistors 446, 444, 442 (in particular transistor 442) may be driven into the triode region of operation. For PMOS transistors, the triode region is entered when $V_{GS} < V_{TH}$ and $V_{DS} > V_{GS} - V_{TH}$, where $V_{GS}$ is the gate-source voltage, $V_{DS}$ is the drain-source voltage and $V_{TH}$ is the threshold voltage. For NMOS transistors, the triode region is entered when $V_{GS} > V_{TH}$ and $V_{DS} < V_{GS} - V_{TH}$.

Incidentally, these conditions are true for long-channel effect MOSFETs. For short-channel devices, the triode region condition is defined with respect to $V_{DS,SAT}$ (e.g. $V_{DS} > (V_{GS} - V_{TH})$ and $V_{DS} < V_{DS,SAT}$).

When operating in the triode region, the first current-mirror arrangement 440 becomes unstable and the current mirrored to the output current path 490 by the first current-mirror arrangement 440 may not be accurate. It is not desirable to have to restrict the voltage range at the output node 469, to prevent the PMOS transistors of the first current-mirror arrangement 440 from entering the triode region to avoid this problem. For PMOS current-mirrors, this would put an upper limit on the voltage at the output node 469. For NMOS current-mirrors, this would put a lower limit on the voltage at the output node 469.

Figure 2:
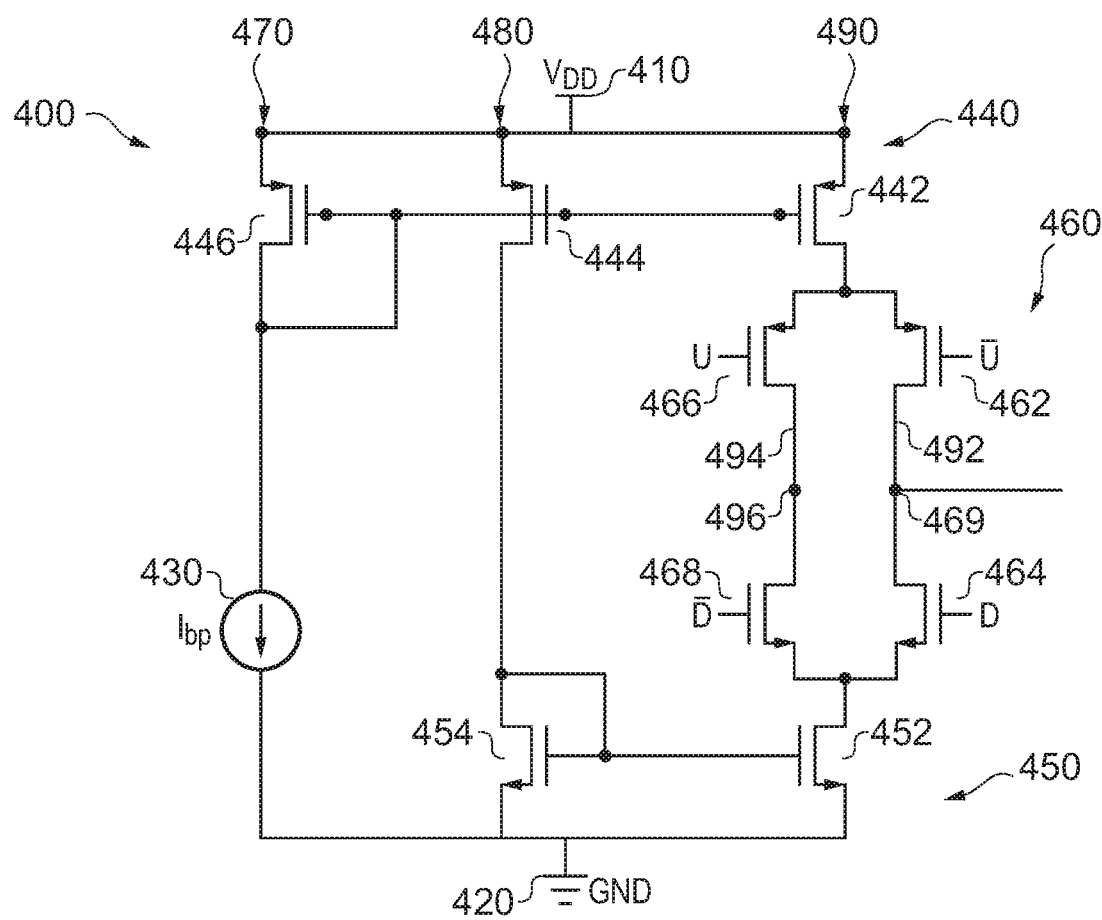
FIG. 2 is another schematic diagram of a charge pump circuit.

With reference to FIG. 2 above, it has been found that the stability of the first current-mirror arrangement 440 may be improved and the compliance range of the charge pump circuit 400 may be increased (i.e. with the first current-mirror arrangement 440 needing smaller headroom or smaller compliance) by introducing a differential amplifier to the charge pump circuit 400.

Figure 3:
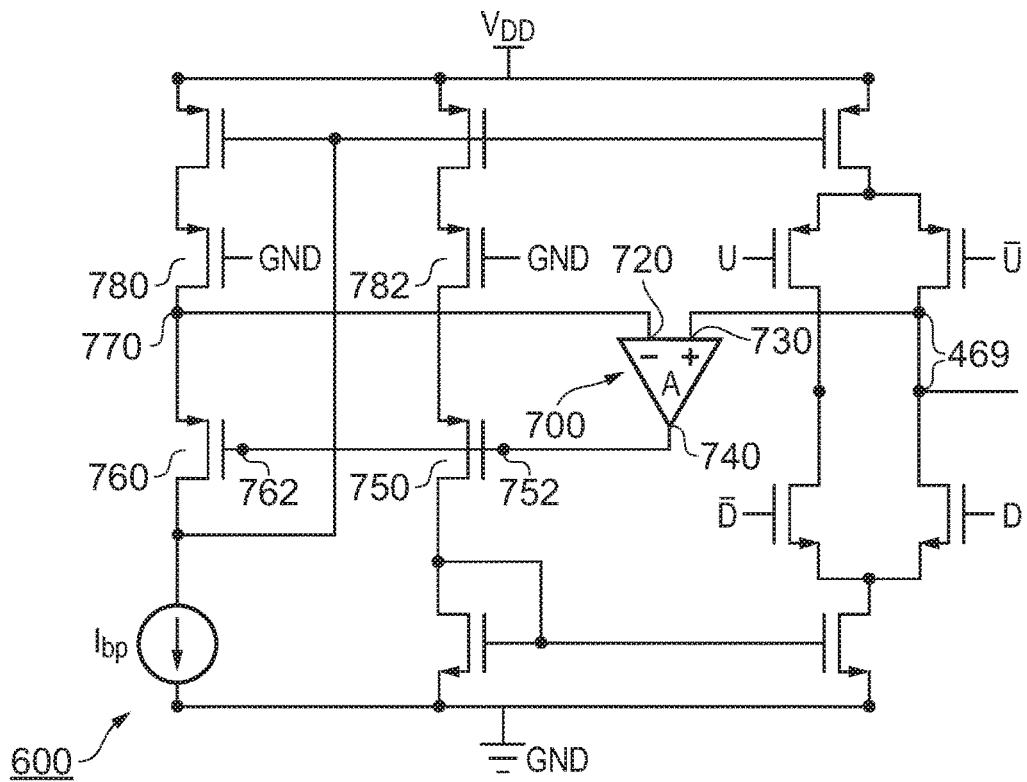
FIG. 3 is a schematic diagram of a charge pump circuit including a differential amplifier.

FIG. 3 is a schematic diagram of a charge pump circuit 600, which functions in the same general way as the charge pump circuit 400 of FIG. 2. Thus, much of the circuit arrangement is the same as in FIG. 2 and duplicate description is omitted. Further, reference signs present in FIG. 2 apply to like elements in FIG. 3, and duplicate reference signs have also largely been omitted.

The difference between the charge pump circuit 600 and charge pump circuit 400 is that it further comprises differential amplifier 700, reference path control transistor 760, auxiliary path control transistor 750, reference path resistance 780 and auxiliary path resistance 782. The differential amplifier 700 comprises differential amplifier first input 720, differential amplifier second input 730 and differential amplifier output 740. The reference path control transistor 760 and the auxiliary path control transistor 750 are PMOS MOSFETs.

Recall that the first current-mirrors transistors 442, 444, 446 of the first current-mirror arrangement 440 are PMOS MOSFET transistors. When the PMOS transistors of the first current-mirror arrangement 440 are functioning in the saturation region, the drain current of each transistor is dependent on its source and gate voltages, but is not dependent on its drain voltage, as illustrated by equation (1) below:

$$I_{D(SAT)} = \frac{K}{2} \cdot (V_{GS} - V_{TH})^2 \qquad (1)$$

where, K is a process transconductance parameter, $V_{TH}$ is the MOSFET threshold voltage and $V_{GS}$ is the MOSFET gate-source voltage.

In the event that a voltage at the output node 469 increases to such an extent that the PMOS transistors of the first current-mirror arrangement 440 are forced into the triode region of operation, the drain current of each transistor becomes dependent on its drain voltage as well as its source and gate voltages, as illustrated by equation (2):

$$I_{D(TRI)} = K \cdot \left[ (V_{GS} - V_{TH}) \cdot V_{DS} - \frac{V_{DS}^2}{2} \right] \qquad (2)$$

where, K is a process transconductance parameter, $V_{TH}$ is the MOSFET threshold voltage, $V_{GS}$ is the MOSFET gate-source voltage and $V_{DS}$ is the MOSFET drain-source voltage.

While the PMOS transistors of the first current-mirror arrangement 440 operate in the saturation region, with the voltage at the output node 469 not rising too high, as long as the gate-source voltages of those transistors are the same (as is ensured by the way they are connected), their drain currents should be closely related by virtue of equation (1) above.

However, in the event that one or more of the PMOS transistors of the first current-mirror arrangement 440 are forced into the triode region, for example by the voltage at the output node 469 rising too high, any differences between their drain-source voltages will lead to differences in their drain currents by virtue of equation (2) above and the current mirroring accuracy will be degraded. This can happen in the charge pump circuit 400 of FIG. 2 because the drain terminals of the first current-mirrors transistors 442, 444, 446 are not tied together in the same way as their gate terminals, and also their source terminals, are. That is, the drain currents of the first current-mirrors transistors 442, 444, 446 may differ due to differences between their drain voltages.

The drain voltage of the first current-mirror transistor 446 of the reference current path 470 and the drain voltage of the first current-mirror transistor 444 of the auxiliary current path 480 can be controlled to closely follow the drain voltage of the first current-mirror transistor 442 of the output current path 490 by introducing the differential amplifier 700 to the charge pump circuit 600 as shown in FIG. 3. By controlling the drain voltages of the first current-mirror transistors 446, 444 in the reference and auxiliary current paths 470, 480 to follow the drain voltage of the first current-mirror transistor 442 in the output current path 490, the drain current of the first current-mirror transistors 442, 444, 446 will be equalised even when those transistors enter the triode region of operation, leading to better current-mirroring performance of the first current-mirror arrangement 440.

The role of the differential amplifier 700 here will now be explored.

With reference to FIG. 3, the reference path resistance 780 is connected into the reference current path 470 between the first current-mirror transistor 446 and the current source 430, and the auxiliary path resistance 782 is connected into the auxiliary current path 480 between the first current-mirror transistor 444 and the second current-mirror transistor 454. The reference path control transistor 760 is connected into the reference current path 470 between the reference path resistance 780 and the current source 430, and the auxiliary path control transistor 750 is connected into the auxiliary current path 480 between the auxiliary path resistance 782 and the second current-mirror transistor 454.

That is, the reference path control transistor 760 is connected is series with the reference path resistance 780 on the drain-terminal side of the first current-mirror transistor 446 along the reference current path 470, and the auxiliary path control transistor 750 is connected in series with the auxiliary path resistance 782 on the drain-terminal side of the first current-mirror transistor 444 along the auxiliary current path 480. Note that the gate terminal of the first current-mirror transistor 446 is now connected instead at the drain terminal of the reference path control transistor 760.

The reference path resistance 780 and the auxiliary path resistance 782 are implemented as PMOS MOSFETs controlled to be on. In FIG. 3, their gate terminals are connected to the low voltage supply (ground or GND) 200. A reference path node 770 is defined between the reference path resistance 780 and the reference path control transistor 760.

The differential amplifier first input 720 is connected to the reference path node 770, i.e. effectively to the drain terminal of the reference path resistance 780. The differential amplifier second input 730 is connected to the output path node 469, i.e. effectively to the drain terminal of the first steering transistor 462. The differential amplifier output 740 is connected to the gate terminal 752 of the auxiliary path control transistor 750 and to the gate terminal 762 of the reference path control transistor 760.

The differential amplifier first input 720 and differential amplifier second input 730 could instead be connected to the drain terminals of the first current-mirror transistors in the relevant paths, but it is preferable to connect them as in FIG. 3 so that differential amplifier second input 730 is connected to the output path node 469.

It will be appreciated that a voltage signal at the reference path node 770 will be indicative of the drain voltage of the first current-mirror transistor 446 of the reference current path 470. That is, the voltage signal at the reference path node 770 is the drain voltage of the first current-mirror transistor 446 of the reference current path 470 minus the voltage drop across the reference path resistance 780. This signal is input to the differential amplifier first input 720, as a first input signal. The differential amplifier first input 720 is the inverting input of the differential amplifier 700, and the first input signal serves as a feedback signal.

Similarly, a voltage signal at the output node 469 will be indicative of the drain voltage of the first current-mirror transistor 442 of the output current path 490. That is, the voltage signal at the output node 469 is the drain voltage of the first current-mirror transistor 442 minus the voltage drop across the first steering transistor 462. This signal is input to the differential amplifier second input 730, as the second input signal. The differential amplifier second input 730 is the non-inverting input of the differential amplifier 700, and the second input signal serves as a reference signal.

The differential amplifier 700 is configured to generate an amplified output signal which is based on the difference between the first input signal (i.e. the feedback signal) and the second input signal (i.e. the reference signal), thereby introducing negative feedback into the charge pump circuit 600.

The amplified output signal is provided to the gate terminal 752 of the auxiliary path control transistor 750 and to the gate terminal 762 of the reference path control transistor 760, so as to control those transistors. The differential amplifier 700 thereby controls the voltage at node 770 via the reference path control transistor 760 to tend to equalise it with the voltage at the output node 469 (providing the differential amplifier 700 has sufficient gain), and applying corresponding control to the auxiliary path via the auxiliary path control transistor 750.

The reference path resistance 780 and the auxiliary path resistance 782 replicate the voltage drop between the first current-mirror transistor 442 and the output node 469 generated by the first steering transistor 464. For example, in the event that the first steering transistor 462 is fully conducting, it is in the same state as the reference path resistance 780 and the auxiliary path resistance 782. This ensures that the voltage at the source terminal of the reference path control transistor 760 and the source terminal of auxiliary path control transistor 750 is equivalent to the voltage at the output node 469. More importantly, this means that by controlling the voltages at the source terminals of the reference path control transistor 760 (i.e. the reference path node 770) and the auxiliary path control transistor 750, the drain voltages of the first current-mirror transistor 446 and the first current-mirror transistor 444 tend to be equalized with the drain voltage of the first current-mirror transistor 442 of the output current path 490 (providing the differential amplifier 700 has sufficient gain).

The active negative feedback provided by the differential amplifier 700, as described above, thereby provides a means for maintaining accurate current mirroring even in a case where the first current-mirror transistors 446, 444, 442 are operating in the triode region. This enables the first current-mirror transistors 442, 444, 446 to be sized for higher overdrive voltage (i.e. lower thermal noise) and the gain of the differential amplifier 700 improves the current mirroring. The differential amplifier 700 also provides noise cancelling characteristics by virtue of the gain associated with the feedback loop, as will become apparent.

Unfortunately, despite the current-mirroring improvements provided by the charge pump circuit 600 of FIG. 3, the inventor has identified that the specific arrangement of the differential amplifier 700 in FIG. 3 causes the output current provided at the output node 469 to suffer from noise degradation.

Figure 4:
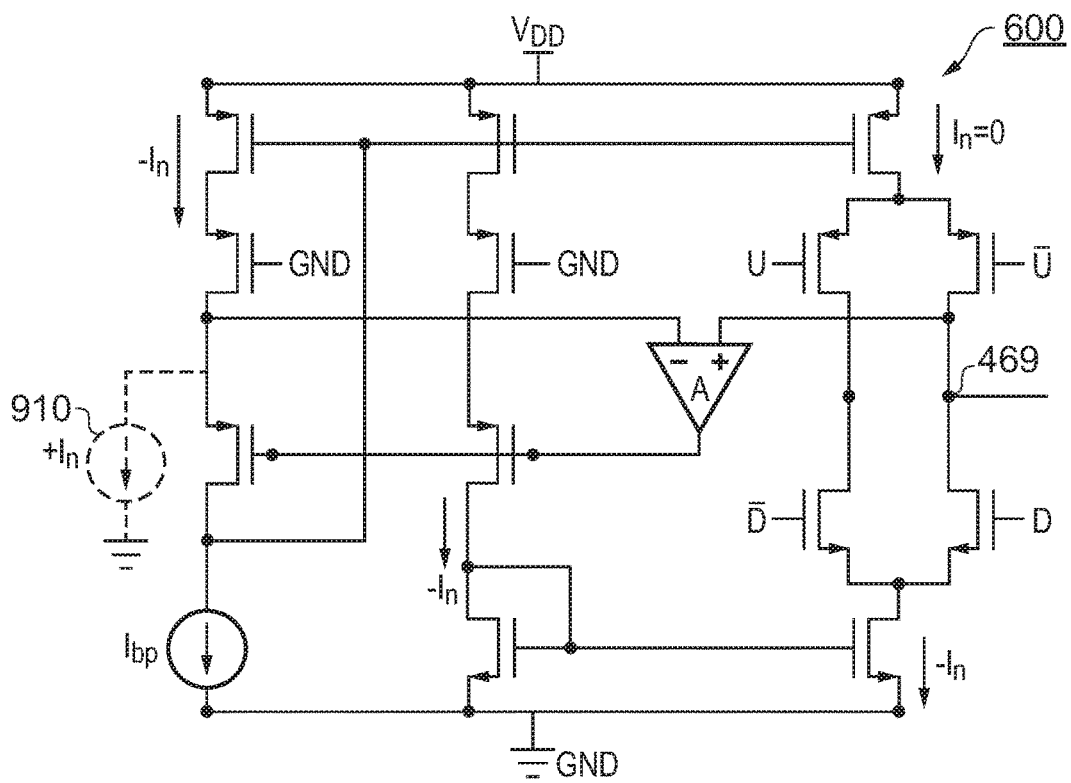
FIG. 4 is a schematic diagram of a charge pump circuit including noise contribution from the differential amplifier.

FIG. 4 is a further schematic diagram of the charge pump circuit 600, useful for understanding the noise contribution of the differential amplifier 700. Thus, much of the circuit arrangement is the same as in FIG. 3 and duplicate description is omitted. Further, reference signs present in FIG. 3 apply to like elements in FIG. 4, and duplicate reference signs have also largely been omitted.

In FIG. 4, the principle of noise superposition will be used to help understand the noise impact.

Firstly, the noise injected by the differential amplifier 700 and the reference path control transistor 760 is represented by noise source 910 along the reference current path 470.

A positive noise signal (+In) generated by the noise source 910 is introduced to the auxiliary current flowing in the auxiliary current path 480. The positive noise signal is also introduced to the voltage signal at the reference path node 770, which is input to the differential amplifier first input 720 as the first input signal (i.e. the feedback signal). The differential amplifier compares the first input signal to the second input signal (i.e. the reference signal), which second input signal is input to the differential amplifier second input 730 from the output node 469. The differential amplifier 700 outputs the amplified output signal to the gate terminal 762 of the reference path control transistor 760 (ignoring for now that the amplified output signal is also output to the gate terminal 752 of the auxiliary path control transistor 750). The feedback action forces the introduction of a negative noise signal (−In), which is the inverse of the positive noise signal, to the reference current path 470 by the reference current path control transistor 760 (providing the benefit of the noise cancelling due to active negative feedback). Thus, the reference current flowing in the reference current path 470 includes the positive noise signal (+In) and the negative noise signal (−In), which will (in the ideal case) cancel resulting is no noise contribution (In=0) in the reference current flowing in the reference current path 470.

Thus, in terms of the noise injected by the differential amplifier 700 and the reference path control transistor 760, the cancelled noise (a zero noise component ln=0) in the reference current path 470 is mirrored to the output current path 490 at first current-mirror transistor 442 via the first current-mirror arrangement 440 (by first current-mirror transistors 446 and 442) and also to the output current path 490 at second current-mirror transistor 452 via the first current-mirror arrangement 440 (by first current-mirror transistors 446 and 444 into the current in the auxiliary current path 480) and the second current-mirror arrangement 450. Thus, this zero noise component is experienced in the output current path 490 at first current-mirror transistor 442 and at the second current-mirror transistor 452.

However, as eluded to earlier, the amplified output signal is also output to the gate terminal 752 of the auxiliary path control transistor 750. The feedback action therefore also forces the introduction of the negative noise signal (−In), which is the inverse of the positive noise signal, to the auxiliary current path 480 by the auxiliary current path control transistor 750. Thus, in terms of the noise injected by the differential amplifier 700 and the reference path control transistor 760, the negative noise signal is mirrored to the output current path 490 at second current-mirror transistor 452 via the second current-mirror arrangement 450. Thus, this negative noise signal is experienced in the output current path 490 at the second current-mirror transistor 452 but not at the first current-mirror transistor 442. This noise imbalance detrimentally affects the output current at the output node 469.

Focussing secondly (and separately, using superposition) on the noise injected by the differential amplifier 700 and the auxiliary path control transistor 750, any such noise (not shown) is also mirrored to the output current path at second current-mirror transistor 452 via the second current-mirror arrangement 450. Thus, such noise is also experienced in the output current path at the second current-mirror transistor 452 but not at the first current-mirror transistor 442. This noise imbalance further detrimentally affects the output current at the output node 469.

The inventor has devised charge pump circuit 1000 which provides improved PMOS transistor current-mirror stability (as in FIGS. 3 and 4) while also reducing the noise impact of the differential amplifier 700 as described above.

Figure 5:
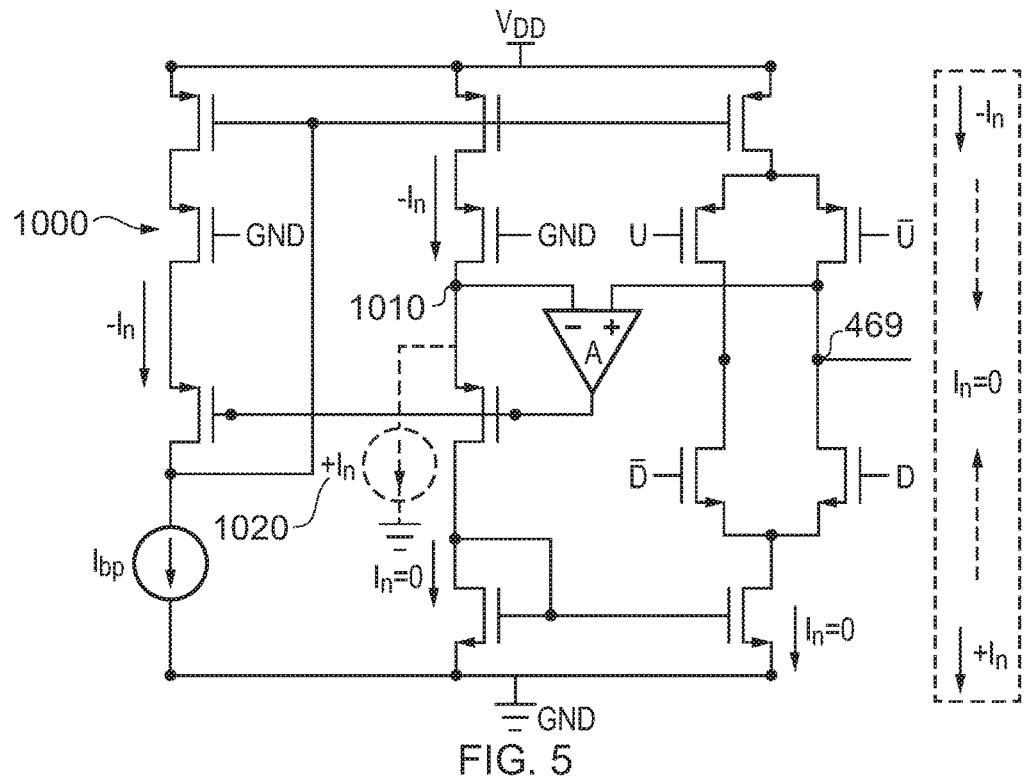
FIG. 5 is a schematic diagram of a charge pump circuit including a noise cancelling differential amplifier arrangement.

FIG. 5 is a schematic diagram of charge pump circuit 1000 embodying the present invention. The charge pump circuit 1000 functions in a similar way to the charge pump circuit 600 of FIG. 3. Thus, much of the circuit arrangement is the same as in FIG. 3 and duplicate description is omitted. Further, reference signs present in FIG. 3 apply to like elements in FIG. 5, and duplicate reference signs have also largely been omitted.

The difference between the charge pump circuit 1000 and the charge pump circuit 600 is very significant in terms of noise performance. It will be appreciated that the difference is from where the differential amplifier 700 receives its feedback signal. In this regard, in the charge pump circuit 1000 an auxiliary path node 1010 is defined between the auxiliary path control transistor 750 and the auxiliary path resistance 782. In the charge pump circuit 1000 of FIG. 5, the differential amplifier first input 720 receives its feedback signal not from the reference path node 770 but rather from the auxiliary path node 1010.

It will already be appreciated that a voltage signal at the auxiliary path node 1010 is indicative of the drain voltage of the first current-mirror transistor 444 of the auxiliary current path 480. That is, the voltage at the auxiliary path node 1010 is the drain voltage of the first current-mirror transistor 444 of the auxiliary current path 480 minus the voltage drop across the auxiliary path resistance 782. Thus, it will be appreciated that the function of the charge pump circuit 1000 in terms of the active negative feedback provided by the differential amplifier 700, as described above, also provides a means for maintaining accurate current mirroring even in a case where the first current-mirror transistors 446, 444, 442 are operating in the triode region.

However, because the differential amplifier first input 720 receives its feedback signal not from the reference path node 770 but rather from the auxiliary path node 1010, the noise impact of the differential amplifier 700 on the output current at the output node 469 is significantly reduced.

In order to explore this, a similar noise analysis as performed in connection with FIG. 4 will be performed in connection with FIG. 5. Again, the principle of noise superposition will be used to help understand the noise impact.

Firstly, given that the differential amplifier first input 720 now receives its feedback signal from the auxiliary path node 1010, noise injected by the differential amplifier 700 and the auxiliary path control transistor 750 is represented by a noise source 1020 along the auxiliary current path 480.

A positive noise signal (+In) generated by the noise source 1020 is introduced to the auxiliary current flowing in the auxiliary current path 480. The positive noise signal is also introduced to the voltage signal at the auxiliary path node 1010, which is input to the differential amplifier first input 720 as the first input signal (i.e. the feedback signal). The differential amplifier compares the first input signal to the second input signal (i.e. the reference signal), as before, which second input signal is input to the differential amplifier second input 730 from the output node 469. The differential amplifier 700 outputs the amplified output signal to the gate terminal 752 of the auxiliary path control transistor 750 (ignoring for now that the amplified output signal is also output to the gate terminal 762 of the reference path control transistor 760). The feedback action forces the introduction of a negative noise signal (−In), which is the inverse of the positive noise signal, to the auxiliary current path 480 by the auxiliary current path control transistor 750 (providing the benefit of the noise cancelling due to active negative feedback as before). Thus, the auxiliary current flowing in the auxiliary current path 480 includes the positive noise signal (+In) and the negative noise signal (−In), which will (in the ideal case) cancel resulting is no noise contribution (In=0) in the auxiliary current flowing in the auxiliary current path 480.

Thus, in terms of the noise injected by the differential amplifier 700 and the auxiliary path control transistor 750, the cancelled noise (a zero noise component) in the auxiliary current path 480 is mirrored to the output current path at second current-mirror transistor 452 via the second current-mirror arrangement 450. Thus, this zero noise component is experienced in the output current path 490 at the second current-mirror transistor 452.

As eluded to earlier, the amplified output signal is also output to the gate terminal 762 of the reference path control transistor 760. The feedback action therefore also forces the introduction of the negative noise signal (−In), which is the inverse of the positive noise signal (+In), to the reference current path 470 by the reference current path control transistor 760. Thus, in terms of the noise injected by the differential amplifier 700 and the auxiliary path control transistor 750, the negative noise signal (−In) in the reference current path 470 is mirrored to the output current path 490 at first current-mirror transistor 442 via the first current-mirror arrangement 440 (by first current-mirror transistors 446 and 442) and also to the output current path 490 at second current-mirror transistor 452 via the first current-mirror arrangement 440 (by first current-mirror transistors 446 and 444 into the current in the auxiliary current path 480) and the second current-mirror arrangement 450, but inverted to the positive noise signal (+In) due to the change from PMOS to NMOS between the two current-mirror arrangements. Thus, the negative noise signal (−In) is experienced in the output current path at first current-mirror transistor 442 and in inverted form (+In) at the second current-mirror transistor 452. These complementary noise signals −In and +In affect the output current at the output node 469 but effectively cancel each other out (in the ideal case) as indicated in FIG. 5.

Focussing secondly (and separately, using superposition) on the noise injected by the differential amplifier 700 and the reference path control transistor 760, any such noise is also mirrored to the output current path 490 at first current-mirror transistor 442 via the first current-mirror arrangement 440 (by first current-mirror transistors 446 and 442) and also to the output current path 490 at second current-mirror transistor 452 via the first current-mirror arrangement 440 (by first current-mirror transistors 446 and 444 into the current in the auxiliary current path 480) and the second current-mirror arrangement 450, but inverted due to the change from PMOS to NMOS between the two current-mirror arrangements. Thus, positive and negative components of this further noise (not shown) are experienced in the output current path at first current-mirror transistor 442 and at the second current-mirror transistor 452, respectively. These complementary noise signals affect the output current at the output node 469 but also effectively cancel each other out (in the ideal case) similarly to noise signals +In and −In.

Advantageously, therefore, the overall noise experience in the output current at the output node 469 of the charge pump circuit 1000 is reduced compared to that of the charge pump circuit 600. In particular, noise injected by the differential amplifier 700 and the auxiliary path control transistor 750 is cancelled in the output current, and so is noise injected by the differential amplifier 700 and the reference path control transistor 760.

It is recalled that the charge pump circuit 1000 retains the advantage (also held by charge pump circuit 600) of improving current-mirroring by keeping the mirroring stable and accurate even if the PMOS current-mirror arrangement 440 is forced into the triode region.

Figure 6:
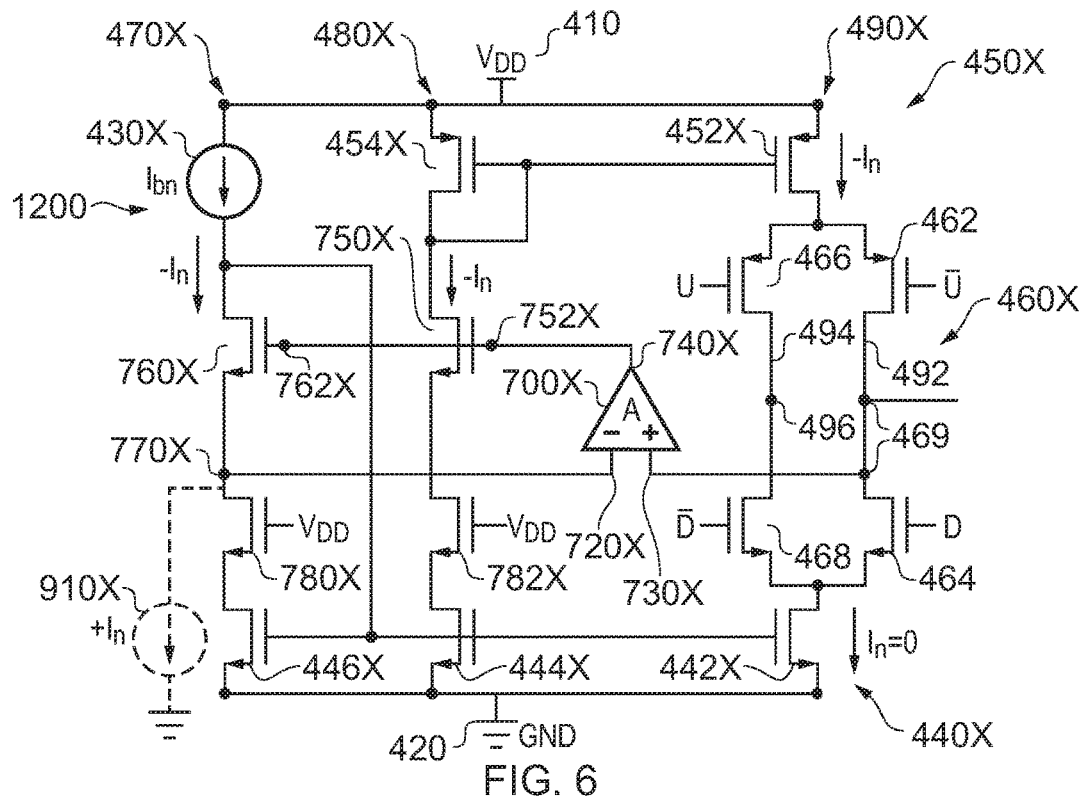
FIG. 6 is another schematic diagram of a charge pump circuit including a differential amplifier.
Figure 7:
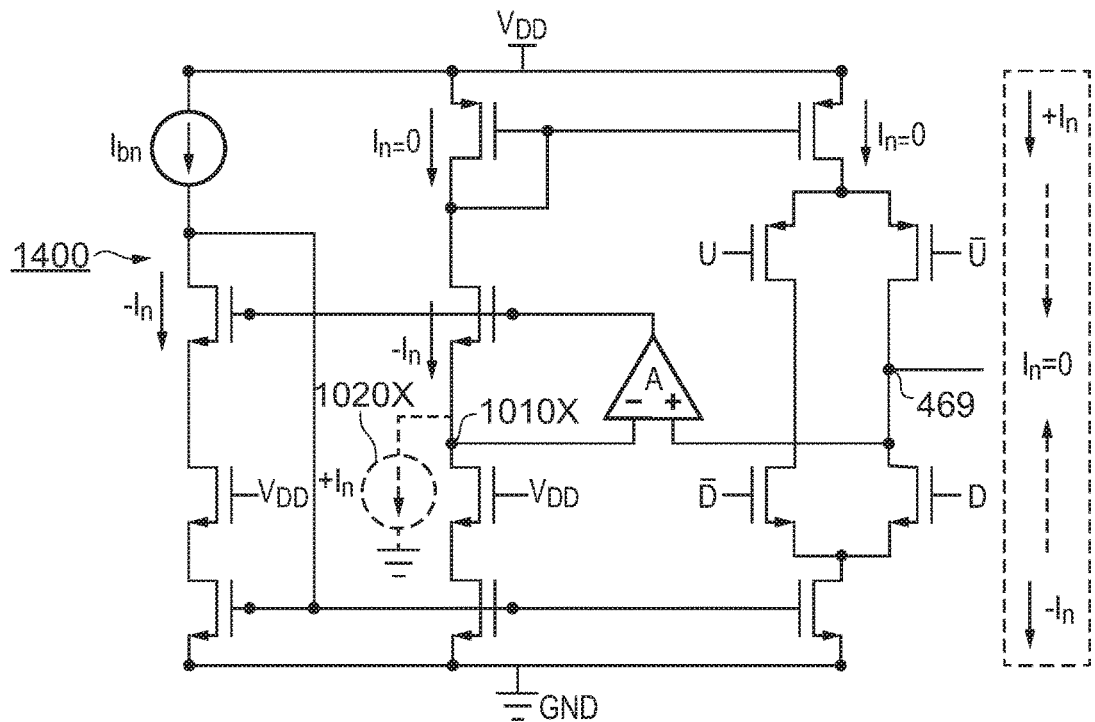
FIG. 7 is another schematic diagram of a charge pump circuit including a noise cancelling differential amplifier arrangement.

Corresponding advantages can also be enjoyed by a charge pump circuit which is effectively implemented "the other way up", i.e. with an NMOS first current-mirror arrangement and a PMOS second current-mirror arrangement, as illustrated by FIGS. 6 and 7.

In overview, FIG. 6 is a schematic diagram of charge pump circuit 1200 corresponding to the charge pump circuit 600 but being the other way up. The charge pump circuit 1200 therefore has the advantage of improving current-mirroring by keeping the mirroring stable and accurate even if the NMOS current-mirror arrangement is forced into the triode region (by the voltage level at the output node 469 going low). However, it also has the problem that noise is experienced in the output current path 490 at the PMOS second current-mirror transistor Nit not at the NMOS first current-mirror transistor leading to imbalance which detrimentally affects the output current at the output node 469.

In contrast, FIG. 7 is a schematic diagram of charge pump circuit 1400 corresponding to the charge pump circuit 1000 but also being the other way up. The charge pump circuit 1400 therefore also has the advantage of improving current-mirroring by keeping the mirroring stable and accurate even if the NMOS current-mirror arrangement is forced into the triode region (by the voltage level at the output node 469 going low). It also has the advantage that noise injected by the differential amplifier and the auxiliary path control transistor is cancelled in the output current, as is noise injected by the differential amplifier and the reference path control transistor.

Focussing firstly on FIG. 6, it will readily be appreciated that charge pump circuit 1200 corresponds to charge pump circuit 600. To avoid duplicate description, like reference signs between the charge pump circuit 600 and the charge pump circuit 1200 denote like elements. Where there are elements in charge pump circuit 1200 which correspond to elements in charge pump circuit 600 but which have been changed/moved due to the charge pump circuit 1200 being the other way up compared to the charge pump circuit 600, the corresponding elements in charge pump circuit 1200 have been given the same reference numerals but with the suffix X.

For example, the reference, auxiliary, and output paths 470X 480X and 490X, correspond to paths 470, 480 and 490, respectively. The first current-mirror arrangement 440X corresponds to arrangement 440, but its first current-mirror transistors 442X, 444X, and 446X are NMOS MOSFETS and their source terminals are connected together at the low voltage source 420. The second current-mirror arrangement 450X corresponds to arrangement 450, but its second current-mirror transistors 452X and 454X are PMOS MOSFETS and their source terminals are connected together at the high voltage source 410.

The output current path 490X is still divided into first and second parallel sub-paths 492 and 494 but these are between the second current-mirror transistor 452X and the first current-mirror transistor 442X.

The switching means 460 is connected in the first and second parallel sub-paths 492 and 494 as before. Thus, because the first and second current-mirror arrangements have effectively been swapped around, the first and second steering transistors 462 and 464 are connected along the first parallel sub-path 492 between the second current-mirror transistor 452X and the first current-mirror transistor 442X in that order. The third and fourth steering transistors 466 and 468 are connected along the second parallel sub-path 494 between the second current-mirror transistor 452X and the first current-mirror transistor 442X in that order. The output node 469 and bypass node 496 are defined as before, with the output node 469 configured to output an output current signal to external circuitry.

The current source 430X is connected in the reference current path 470X (effectively sourcing current from the high voltage source 410) and generates a reference or bias current Ibn in the reference current path 470X.

The differential amplifier 700X, reference path control transistor 760X, auxiliary path control transistor 750X, reference path resistance 780X and auxiliary path resistance 782X, correspond to the differential amplifier 700, reference path control transistor 760, auxiliary path control transistor 750, reference path resistance 780 and auxiliary path resistance 782, respectively, except that the reference path control transistor 760X, auxiliary path control transistor 750X, reference path resistance 780X and auxiliary path resistance 782X are NMOS MOSFETs. These transistors are connected into their respective current paths in a corresponding manner as to in FIG. 3, with the reference path resistance 780X and the auxiliary path resistance 782X controlled to be on.

The reference path node 770X is defined between the reference path resistance 780X and the reference path control transistor 760X, and the differential amplifier 700X is connected in a corresponding manner as to in FIG. 3. Thus, a voltage signal at the reference path node 770X will be indicative of the drain voltage of the first current-mirror transistor 446X and serves as the feedback signal. Similarly, a voltage signal at the output node 469 will be indicative of the drain voltage of the first current-mirror transistor 442X, and serves as a reference signal.

Thus, the explanation concerning the operation of charge pump circuit 600 in connection with FIGS. 3 and 4 applies mutatis mutandis to the operation of charge pump circuit 1200 in connection with FIG. 6.

In particular, the active negative feedback provided by the differential amplifier 700X provides a means for maintaining accurate current mirroring even in a case where the NMOS first current-mirror transistors 446X, 444X, 442X are operating in the triode region. This enables the first current-mirror transistors 442X, 444X, 446X to be sized for higher overdrive voltage (i.e. lower thermal noise) and the gain of the differential amplifier 700X improves the current mirroring.

Further, in terms of the noise injected by the differential amplifier 700X and the reference path control transistor 760X (see effective noise source 910X which corresponds to effective noise source 910), a negative noise signal is experienced in the output current path at the second current-mirror transistor 452X but not at the first current-mirror transistor 442X. This noise imbalance detrimentally affects the output current at the output node 469. The noise injected by the differential amplifier 700X and the auxiliary path control transistor 750X is also mirrored to the output current path at second current-mirror transistor 452X via the second current-mirror arrangement 450X. Thus, such noise is also experienced in the output current path at the second current-mirror transistor 452X but not at the first current-mirror transistor 442X. This noise imbalance further detrimentally affects the output current at the output node 469.

Focussing secondly on FIG. 7, it will readily be appreciated that charge pump circuit 1400 corresponds to charge pump circuit 1000 but is the other way up so to speak. Again, to avoid duplicate description, like reference signs denote like elements. Duplicate reference signs have also largely been omitted as compared to FIG. 6 as much of the circuit arrangement is the same.

The difference between the charge pump circuit 1400 and the charge pump circuit 1200 is again significant in terms of noise performance. It will be appreciated that the difference is where the differential amplifier 700X receives its feedback signal from. In this regard, an auxiliary path node 1010X is defined between the auxiliary path control transistor 750X and the auxiliary path resistance 782X. In the charge pump circuit 1400 of FIG. 7, the differential amplifier first input 720X receives its feedback signal not from the reference path node 770X but rather from the auxiliary path node 1010X.

Thus, the explanation concerning the operation of charge pump circuit 1000 in connection with FIG. 5 applies mutatis mutandis to the operation of charge pump circuit 1400 in connection with FIG. 7.

In particular, the active negative feedback provided by the differential amplifier 700X still provides a means for maintaining accurate current mirroring even in a case where the NMOS first current-mirror transistors 446X, 444X, 442X are operating in the triode region.

Further, in terms of the noise injected by the differential amplifier 700X and the auxiliary path control transistor 750X (see effective noise source 1020X which corresponds to effective noise source 1020), a negative noise signal (−In) is experienced in the output current path at first current-mirror transistor 442X and in inverted form (+In) at the second current-mirror transistor 452X. These complementary noise signals −In and +In affect the output current at the output node 469 but effectively cancel each other out (in the ideal case) as indicated in FIG. 7—indeed these complementary noise signals −In and +In in effect cancel at the auxiliary path. The noise injected by the differential amplifier 700X and the reference path control transistor 760X is also mirrored to the output current path at first current-mirror transistor 442X via the first current-mirror arrangement 440X and also to the output current path at second current-mirror transistor 452X via the first current-mirror arrangement 440X and the second current-mirror arrangement 450X, but inverted. Thus, positive and negative components of this further noise (not shown) are experienced in the output current path at first current-mirror transistor 442X and at the second current-mirror transistor 452X, respectively. These complementary noise signals affect the output current at the output node 469 but also effectively cancel each other out (in the ideal case) similarly to noise signals +In and −In.

Advantageously, therefore, the overall noise experience in the output current at the output node 469 of the charge pump circuit 1400 is reduced compared to that of the charge pump circuit 1200.

The charge pump charge pump circuit 1400 and the charge pump circuit 1000 therefore have corresponding performance except that the charge pump circuit 1000 maintains accurate current mirroring in a case when its PMOS first current-mirror transistors are forced into the triode region whereas the charge pump circuit 1400 maintains accurate current mirroring in a case when its NMOS first current-mirror transistors are forced into the triode region.

Figure 8:
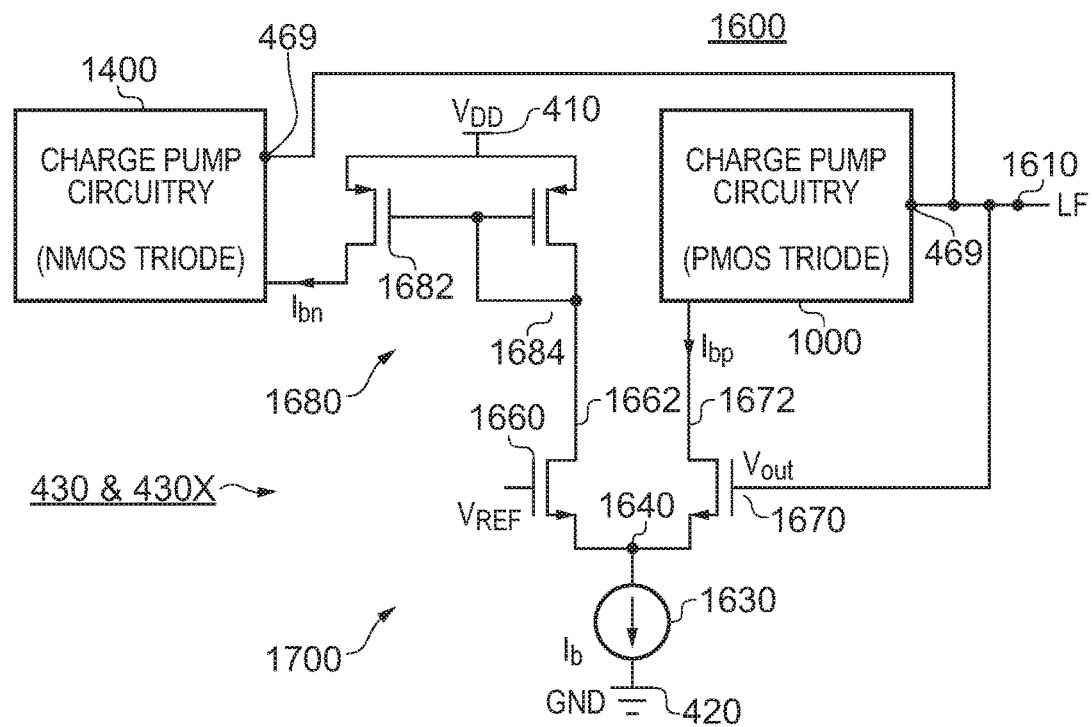
FIG. 8 is a schematic diagram of an example implementation of the charge pump circuits of FIGS. 5 and 7.

FIG. 8 is a schematic diagram of dual charge pump circuit 1600, in which the PMOS current-mirror enhancing charge pump circuit 1000 of FIG. 5, and the NMOS current-mirror enhancing charge pump circuit 1400 of FIG. 7, have been combined. For simplicity, like reference numerals denote like elements.

Dual charge pump circuit 1600 comprises charge pump circuit 1000 (first charge pump circuitry, for dealing with the PMOS triode region) and charge pump circuit 1400 (second charge pump circuitry, for dealing with the NMOS triode region), with their output nodes connected together to form a common output node 1610. Thus, the current output signals from both charge pump circuits 1000 and 1400 contribute to the current output signal at the common output node 1610.

The other components of dual charge pump circuit 1600 are for controlling the magnitude of the reference currents provided by the current sources 430 and 430X of the charge pump circuits 1000 and 1400, respectively. Indeed, those other components could be considered in combination to serve as the current sources 430 and 430X by generating the reference or bias currents Ibp and Ibn, respectively, such that those current sources have effectively been "pulled out" of the boxes for charge pump circuits 1000 and 1400 in FIG. 8 to be shown explicitly.

The current sources 430 and 430X as implemented in FIG. 8 comprise a shared current source 1630, connected to provide a shared reference or bias current Ib at a tail node 1640. NMOS transistors 1660 and 1670 are connected to the tail node 1640 along respective first and second current paths 1662 and 1672, so as to control how much of the shared reference current Ib flows down those paths as first and second reference currents, respectively.

A current-mirror arrangement 1680, comprising PMOS current-mirror transistors 1682 and 1684, is provided to mirror the first current flowing in the first current path 1662 to a third current path as a third reference current. The source terminals of the current-mirror transistors 1682, 1684 are connected to the voltage source 410, with the current-mirror transistor 1682 connected on the third current path and the current-mirror transistor 1684 connected on the first current path 1662, and with their gate terminals connected together. Further, the gate and drain terminals of the current-mirror transistor 1684 are connected together.

The second current is the reference current Ibp of the current source 430 and the third current is the reference current Ibn of the current source 430X. Thus, these currents are shown exiting/entering their charge pump circuits 1000 and 1400, respectively, from the voltage source 410 and to the voltage source 420, respectively. These currents (in magnitude) sum together to equal the shared reference current Ib.

The transistor 1660 is configured to receive a reference voltage Vref, and the transistor 1670 is configured to receive an output voltage Vout from the combined output node 1610, as control signals. The reference voltage may have a value, for example, halfway between the PMOS MOSFET triode region boundary voltage and the NMOS MOSFET triode region boundary voltage.

Thus, if Vout>Vref, then Ibp>Ibn and the output current of the charge pump circuit 1000 will contribute more to the current output signal at the common output node 1610 than the output current of the charge pump circuit 1400. This is beneficial, because when Vout>Vref it is possible that the PMOS first-current transistors 442, 444, and 446 will enter the triode region and the benefits of the charge pump circuit 1000 in this respect (along with the noise reduction benefits) will dominate in the current output signal at the common output node 1610.

Similarly, if Vout<Vref, then Ibp<Ibn and the output current of the charge pump circuit 1400 will contribute more to the current output signal at the common output node 1610 than the output current of the charge pump circuit 1000. This is beneficial, because when Vout<Vref it is possible that the NMOS first-current transistors 442X, 444X, and 446X will enter the triode region and the benefits of the charge pump circuit 1400 in this respect (along with the noise reduction benefits) will dominate in the current output signal at the common output node 1610.

It will incidentally be understood that in any of the charge pump circuits of FIGS. 3 to 8, the first current-mirrors transistors could all be BJTs rather than MOSFETs. In that case, it is the collector voltages (at their collector terminals) which would be controlled by the present circuitry arrangements. Similarly, and separately, the second current-mirrors transistors could both be BJTs rather than MOSFETs. Similarly, and separately, the reference path and auxiliary path control transistors could both be BJTs rather than MOSFETs. Similarly, and separately, the steering transistors could be BJTs rather than MOSFETs. Generally, the transistors could be BJTs rather than MOSFETs. The present disclosure will be understood accordingly.

Figure 9:
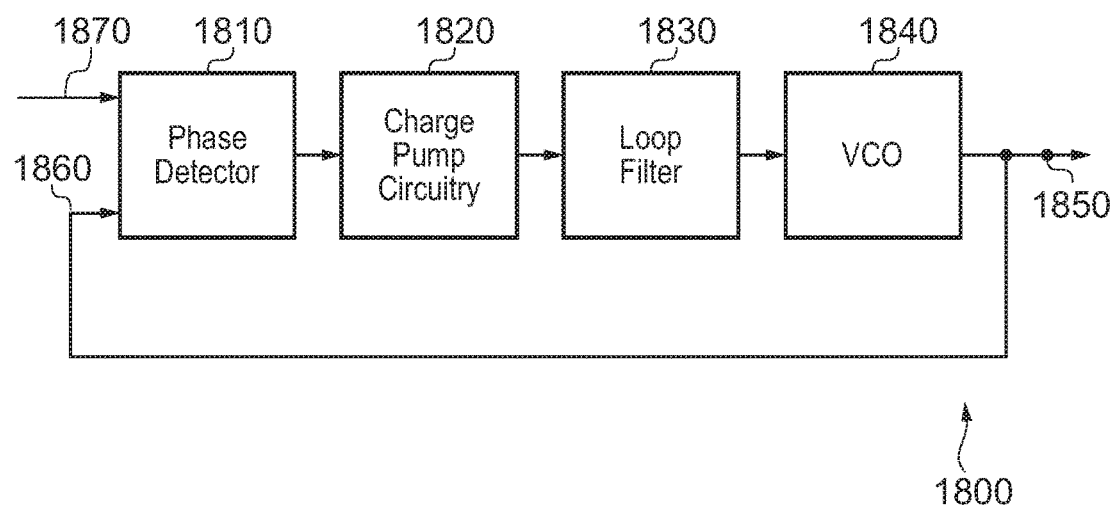
FIG. 9 is a schematic diagram of phase locked loop circuitry which may comprise the charge pump circuit of FIG. 5, 7 or 8.

FIG. 9 is a schematic diagram of phase locked loop circuitry 1800 which comprises the charge pump circuit 1000, 1400 or 1600, indicated here as charge pump circuit 1820. The phase locked loop circuitry 1800 comprises phase detector 1810, the charge pump circuit 1820, loop filter 1830, voltage controlled oscillator (VCO) 1840, output node 1850, feedback node 1860 and reference node 1870.

The phase locked loop circuitry 1800 is configured to output an output signal at its output node 1850 such as a clock signal whose frequency is controlled based on that of a reference signal input to the reference node 1870, by means of negative feedback.

The phase detector 1810 in configured to detect a phase difference between the reference signal input to the reference node 1870 and a feedback signal (based on the output signal) input to the feedback node 1860. The phase detector 1810 outputs a phase detector output signal, which is proportional to the detected phase difference, to the charge pump circuit 1820. This signal controls the UP and DOWN signals (U and D) in the charge pump circuit 1820 so as to control its output current at its output node 469, 1610.

The loop filter 1830 is a low pass filter configured to filter high frequency signals from the phase detector output signal thereby generating a low frequency or DC signal. For example, the loop filter 1830 may comprise a capacitor which is charged/discharged by the output current of the charge pump circuit 1820 with the low frequency or DC signal being based on a potential difference over that capacitor.

The low frequency signal is input to the VCO 1840 to generate a VCO signal being the output signal at the output node 1850.

The phase locked loop circuitry 1800 is locked at a specific frequency when the feedback signal input to the feedback node 1860 and the reference signal input to the reference node 1870 maintain a phase relationship.

Figure 10:
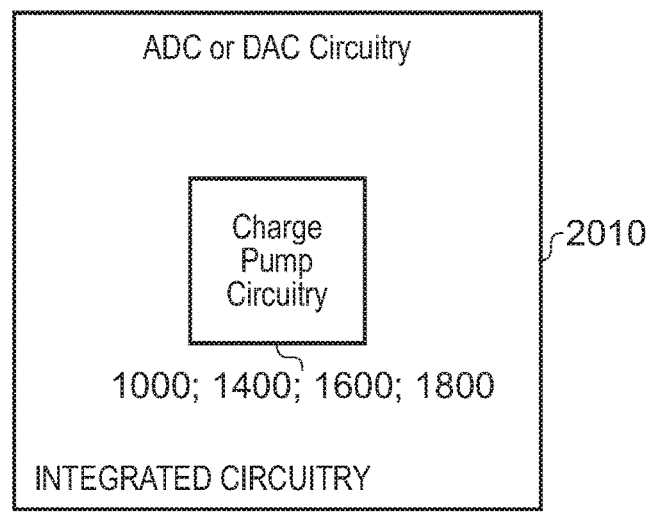
FIG. 10 is a schematic diagram of digital-to-analogue (DAC) circuitry or analogue-to-digital (ADC) circuitry which may comprise the charge pump circuit of FIG. 5, 7 or 8.

FIG. 10 is a schematic diagram of integrated circuitry 2010 embodying the present invention. The integrated circuitry 2010 comprises any of the charge pump circuits embodying the present invention, for example any of the circuits 1000, 1400, 1600 and 1800 discussed above. It will be appreciated from FIG. 9 that the charge pump circuits embodying the present invention may be employed in clock-signal generation circuitry, and thus may be employed in or with mixed-signal circuitry such as DAC or ADC circuitry 2010, as illustrated in FIG. 10.

It will be appreciated that the circuitry disclosed herein could be described as an ADC. Circuitry of the present invention may be implemented as integrated circuitry, for example on an IC chip such as flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. Charge pump circuitry comprising:
 a reference current path, an auxiliary current path and an output current path connected in parallel between high and low voltage sources; and
 a differential amplifier configured to generate an amplifier output signal based upon a difference between first and second input signals,
 wherein:
 the reference current path is configured to cause a reference current to flow along that path;
 the reference, auxiliary and output current paths comprise respective first current-mirror transistors connected in a first current-mirror arrangement so that an auxiliary current flowing along the auxiliary current path and a first output current flowing along a first part of the output current path are dependent on the reference current flowing along the reference current path due to current mirroring;
 the auxiliary and output current paths comprise respective second current-mirror transistors connected in a second current-mirror arrangement so that a second output current flowing along a second part of the output current path is dependent on the auxiliary current flowing along the auxiliary current path due to current mirroring;
 the output current path comprises an output node for connection to an external load to allow current which is dependent on the first and second output currents to flow between the charge pump circuitry and the external load;
 the auxiliary current path comprises a control transistor connected in series with the first current-mirror transistor of that path; and
 the differential amplifier is connected to receive its first and second input signals from first nodes in the auxiliary and output current paths, respectively, the signals generated at the first nodes being indicative of the drain or collector voltages of the first current-mirror transistors in those paths, and configured to control the control transistor with its amplifier output signal so as to control the drain or collector voltage of the first current-mirror transistor in the auxiliary path.

2. Charge pump circuitry as claimed in claim 1, wherein:
 the reference current path comprises a control transistor connected in series with the first current-mirror transistor of that path; and
 the differential amplifier is configured to control the control transistors with its amplifier output signal so as to control the drain or collector voltages of the first current-mirror transistors in the auxiliary and reference paths.

3. Charge pump circuitry as claimed in claim 1, wherein the differential amplifier is configured to control the control transistor or both of the control transistors with its amplifier output signal so as to tend to equalise the drain or collector voltages of the first current-mirror transistors concerned.

4. Charge pump circuitry as claimed in claim 1, wherein the reference current path comprises a current source configured to regulate the reference current.

5. Charge pump circuitry as claimed in claim 1, wherein the control transistor or each of the control transistors is connected in series with the first current-mirror transistor of its path on the drain-terminal or collector-terminal side of that first current-mirror transistor.

6. Charge pump circuitry as claimed in claim 1, wherein the output current path is split into first and second parallel sub-paths between the first current-mirror transistor and the second current-mirror transistor in the output current path, and wherein the sub-paths comprise switching means configured to control the flow of the first and second output currents in the sub-paths.

7. Charge pump circuitry as claimed in claim 6, wherein the switching means comprises first and second steering transistors connected in series along the first sub-path in a direction from the first current-mirror transistor to the second current-mirror transistor of the output current path, and third and fourth steering transistors connected in series along the second sub-path in said direction.

8. Charge pump circuitry as claimed in claim 7, wherein the first and third steering transistors are operable to control how much the first output current flows in the first and second sub-paths, and wherein the second and fourth steering transistors are configured to control how much the second output current flows in the first and second sub-paths.

9. Charge pump circuitry as claimed in claim 7, wherein the switching means is configured to receive a first pair of complementary control signals for controlling the first and third steering transistors, respectively, and a second pair of complementary control signals for controlling the second and fourth steering transistors, respectively, optionally wherein the control signals are digital signals.

10. Charge pump circuitry as claimed in claim 7, wherein the control transistor or each of the control transistors is connected in series with the first current-mirror transistor of its path via a resistance.

11. Charge pump circuitry as claimed in claim 10, wherein:
 the output node is on the first sub-path between the first and second steering transistors;
 a bypass node is on the second sub-path between the third and fourth steering transistors; and
 the differential amplifier is connected to receive its first input signal from a node between the resistance and the control transistor of the auxiliary current path and its second input signal from the output node or the bypass node.

12. Charge pump circuitry as claimed in claim 10, wherein:
   each said resistance is implemented as a transistor configured to be on;
   the node at which the differential amplifier receives its first input signal is at the drain or collector terminal of the transistor configured to be on of the auxiliary current path;
   the output node is at the drain or collector terminal of the first steering transistor, and
   the bypass node is at the drain or collector terminal of the third steering transistor.

13. Charge pump circuitry as claimed in claim 1, wherein the differential amplifier is connected to receive its first input signal from the drain or collector terminal of the first current-mirror transistor of the auxiliary current path and its second input signal from the drain or collector terminal of the first current-mirror transistor of the output path.

14. Dual charge pump circuitry, comprising:
   first charge pump circuitry; and
   second charge pump circuitry as claimed in claim 1;
   and control circuitry,
   wherein:
   the output nodes of the first charge pump circuitry and the second charge pump circuitry are connected together to form a common output node; and
   the control circuitry is configured to control the relative magnitudes of the reference currents of the first charge pump circuitry and the second charge pump circuitry in dependence upon a voltage level at the common output node,
   and optionally wherein:
   in the first charge pump circuitry the first current-mirror transistors are PMOS MOSFETs and in the second charge pump circuitry the first current-mirror transistors are NMOS MOSFETs; or
   in the first charge pump circuitry the first current-mirror transistors are PNP BJTs and in the second charge pump circuitry the first current-mirror transistors are NPN BJTs; or
   in the first charge pump circuitry the first current-mirror transistors are PMOS MOSFETs and in the second charge pump circuitry the first current-mirror transistors are NPN BJTs; or
   in the first charge pump circuitry the first current-mirror transistors are PNP BJTs and in the second charge pump circuitry the first current-mirror transistors are NMOS MOSFETs.

15. The dual charge pump circuitry as claimed in claim 14, wherein the control circuitry is configured to control the relative magnitudes of the reference currents of the first charge pump circuitry and the second charge pump circuitry so that:
   the reference current of the first charge pump circuitry is larger than the reference current of the second charge pump circuitry when the voltage level at the common output node is high; and
   the reference current of the second charge pump circuitry is larger than the reference current of the first charge pump circuitry when the voltage level at the common output node is low.

* * * * *